United States Patent
Sasaki et al.

(10) Patent No.: US 9,468,089 B2
(45) Date of Patent: Oct. 11, 2016

(54) EBG STRUCTURE, SEMICONDUCTOR DEVICE, AND CIRCUIT BOARD

(71) Applicant: Kabushiki Kaisha Toshiba, Minato-ku (JP)

(72) Inventors: Tadahiro Sasaki, Nerima (JP); Hiroshi Yamada, Yokohama (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 49 days.

(21) Appl. No.: 14/460,694

(22) Filed: Aug. 15, 2014

(65) Prior Publication Data

US 2015/0084167 A1 Mar. 26, 2015

(30) Foreign Application Priority Data

Sep. 20, 2013 (JP) ................................ 2013-195112

(51) Int. Cl.
| | | |
|---|---|---|
| *H04B 3/28* | (2006.01) | |
| *H05K 1/02* | (2006.01) | |
| *H01L 23/00* | (2006.01) | |
| *H01L 23/498* | (2006.01) | |

(52) U.S. Cl.
CPC ............. *H05K 1/0236* (2013.01); *H01L 24/19* (2013.01); *H01L 23/49822* (2013.01); *H01L 23/49838* (2013.01); *H01L 2224/04105* (2013.01); *H01L 2224/16225* (2013.01); *H01L 2224/24137* (2013.01); *H01L 2924/1531* (2013.01); *H01L 2924/18162* (2013.01); *H01L 2924/19041* (2013.01); *H01L 2924/19042* (2013.01); *H01L 2924/19043* (2013.01); *H01L 2924/19105* (2013.01); *H05K 1/0225* (2013.01); *H05K 1/0231* (2013.01); *H05K 1/0233* (2013.01);
(Continued)

(58) Field of Classification Search
CPC ............. H05K 1/0236; H05K 1/0298; H05K 1/0225; H05K 1/0231; H05K 1/0233; H05K 1/0242; H05K 1/0243; H05K 2201/0715; H05K 2201/19254; H05K 2201/1969; H05K 2201/90727
USPC .......................................................... 333/12
See application file for complete search history.

(56) References Cited

U.S. PATENT DOCUMENTS

| | | | |
|---|---|---|---|
| 8,159,413 B2* | 4/2012 | Park ................ | H01L 23/49822 343/700 MS |
| 2010/0127943 A1 | 5/2010 | Inoue et al. | |
| 2013/0256009 A1 | 10/2013 | Sasaki et al. | |
| 2014/0028412 A1 | 1/2014 | Sasaki et al. | |

FOREIGN PATENT DOCUMENTS

| | | |
|---|---|---|
| JP | 5-121913 | 5/1993 |
| JP | 5-144994 | 6/1993 |

(Continued)

*Primary Examiner* — Robert Pascal
*Assistant Examiner* — Kimberly Glenn
(74) *Attorney, Agent, or Firm* — Oblon, McClelland, Maier & Neustadt, L.L.P.

(57) ABSTRACT

An EBG structure of an embodiment includes an electrode plane, a first insulating layer provided on the electrode plane, a first metal patch provided on the first insulating layer, a second metal patch provided on the first insulating layer, a second insulating layer provided on the first and second metal patches, an interconnect layer provided on the second insulating layer, a third insulating layer provided on the interconnect layer, a first via connected to the electrode plane and the first metal patch, and a second via connected to the electrode plane and the second metal patch. The second metal patch is separately adjacent to the first metal patch. The interconnect layer has a first opening and a second opening. The first via penetrates through the first opening. The second via penetrates through the second opening.

9 Claims, 14 Drawing Sheets

(52) U.S. Cl.
CPC .......... *H05K 1/0242* (2013.01); *H05K 1/0243* (2013.01); *H05K 1/0298* (2013.01); *H05K 2201/0715* (2013.01); *H05K 2201/0969* (2013.01); *H05K 2201/09254* (2013.01); *H05K 2201/09727* (2013.01)

(56) References Cited

FOREIGN PATENT DOCUMENTS

| | | |
|---|---|---|
| JP | 5-152455 | 6/1993 |
| JP | 5-166957 | 7/1993 |
| JP | 6-112352 | 4/1994 |
| JP | 11-017063 | 1/1999 |
| JP | 11-163588 | 6/1999 |
| JP | 11-214580 | 8/1999 |
| JP | 2002-124592 | 4/2002 |
| JP | 2003-133462 | 5/2003 |
| JP | 2004-165560 | 6/2004 |
| JP | 2007-005614 | 1/2007 |
| JP | 2009-105575 | 5/2009 |
| JP | 2009-218966 | 9/2009 |
| JP | 2010-130095 | 6/2010 |
| JP | 2013-207621 | 10/2013 |
| JP | 2014-027559 | 2/2014 |
| KR | WO 2008054324 A1 * 5/2008 ....... H01L 23/49822 |

* cited by examiner

TYPE B

TYPE C

EBG STRUCTURE, SEMICONDUCTOR DEVICE, AND CIRCUIT BOARD

CROSS-REFERENCE TO RELATED APPLICATION

This application is based upon and claims the benefit of priority from Japanese Patent Application No. 2013-195112, filed on Sep. 20, 2013, the entire contents of which are incorporated herein by reference.

FIELD

Embodiments described herein relate generally to an EBG structure, a semiconductor device, and a circuit board.

BACKGROUND

In a circuit board, a SOC (system on chip), a pseudo SOC, or the like, on which a conventional digital/analog/RF mixed circuit is mounted, for example, there is the problem that errors are caused by mutual electromagnetic field interference between devices or noise propagating in GND (ground) or a power supply. To prevent such a problem, it is necessary to provide a wide space between devices. Therefore, it is difficult to reduce chip areas and mounting areas.

To reduce the space, a filter for preventing noise that propagates in the GND or the power supply and is in a frequency region harmful in circuit operation is used, for example. In this case, a filter for lowering the noise level in a limited frequency region, i.e. the cutoff region. The filter is formed with electronic components such as an inductor chip and a capacitor. Therefore, an increase in the number of electronic components is inevitable when the filter is mounted on a circuit board or the like.

In view of this, the use of an EBG (Electromagnetic Band Gap) structure in a dielectric substrate has been suggested, because the size of the circuit board or the like can be more effectively reduced with an EBG structure than with a filter formed with chip components. However, in a case where the cutoff band is set in a low frequency region (6 GHz or lower), the EBG structure becomes large, and the circuit board or the like cannot be made smaller.

DETAILED DESCRIPTION

An EBG structure of an embodiment includes: an electrode plane, a first insulating layer provided on the electrode surface; a first metal patch provided on the first insulating layer; a second metal patch provided on the first insulating layer, the second metal patch being separately adjacent to the first metal patch; a second insulating layer provided on the first and second metal patches; an interconnect layer provided on the second insulating layer, the interconnect layer having a first opening and a second opening; a third insulating layer provided on the interconnect layer; a first via connected to the electrode plane and the first metal patch, the first via penetrating through the first opening; and a second via connected to the electrode plane and the second metal patch, the second via penetrating through the second opening.

In this specification, "semiconductor devices" conceptually include not only semiconductor chips having SOCs (system-on-chips), but also semiconductor components or so-called pseudo SOCs (system-on-chips) each having semiconductor chips that are bonded to one another by resin and are connected to one another by an interconnect layer, for example.

In this specification, "semiconductor components" conceptually include not only semiconductor packages having semiconductor devices sealed therein, but also so-called bare chips with unsealed semiconductor devices.

In this specification, "electronic components" conceptually include components that function electronically, such as semiconductor components and passive components such as antennas, capacitors, and resistors.

In this specification, a "printed wiring board" is a board or a so-called bare board that has a conductive printed wiring board formed thereon but does not have any electronic components mounted thereon.

In this specification, a "circuit board" has electronic components mounted on a printed wiring board.

First Embodiment

An EBG (Electromagnetic Band Gap) structure of this embodiment includes: an electrode plane, a first insulating layer provided on the electrode plane; a first metal patch provided on the first insulating layer; a second metal patch provided on the first insulating layer, the second metal patch being separately adjacent to the first metal patch; a second insulating layer provided on the first and second metal patches; an interconnect layer provided on the second insulating layer, the interconnect layer having a first opening and a second opening; a third insulating layer provided on the interconnect layer; a first via connected to the electrode plane and the first metal patch, the first via penetrating through the first opening; and a second via connected to the electrode plane and the second metal patch, the second via penetrating through the second opening.

Figure 1:
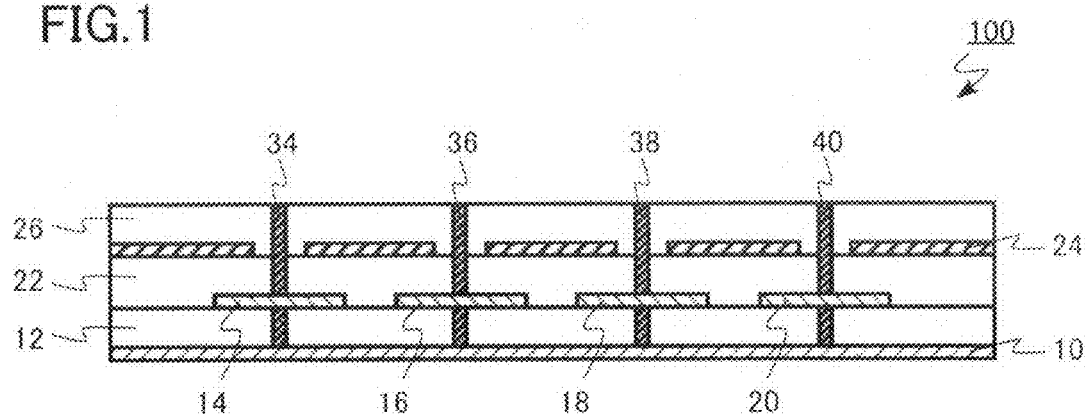
FIG. 1 is a schematic cross-sectional view of an EBG structure of a first embodiment.

FIG. 1 is a schematic cross-sectional view of an EBG structure of this embodiment. The EBG structure 100 of this embodiment includes an electrode plane 10, a first insulating layer 12, first through fourth metal patches 14, 16, 18, and 20, a second insulating layer 22, an interconnect layer 24, a third insulating layer 26, and first through fourth vias 34, 36, 38, and 40.

Figure 2A:
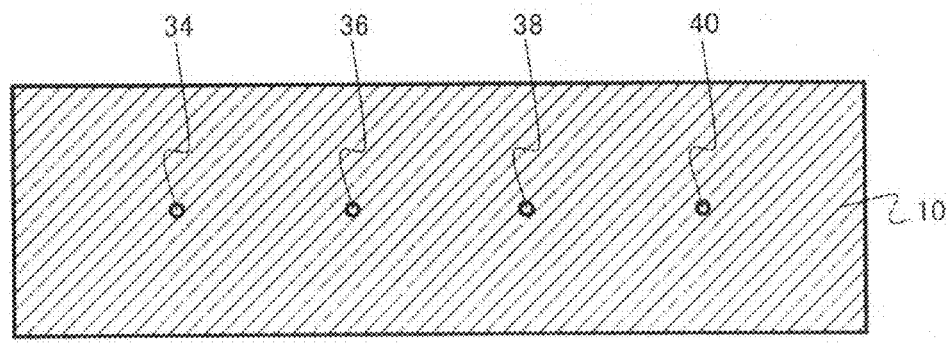
FIGS. 2A through 2C are schematic top views of components of the EBG structure of the first embodiment.
Figure 2B:
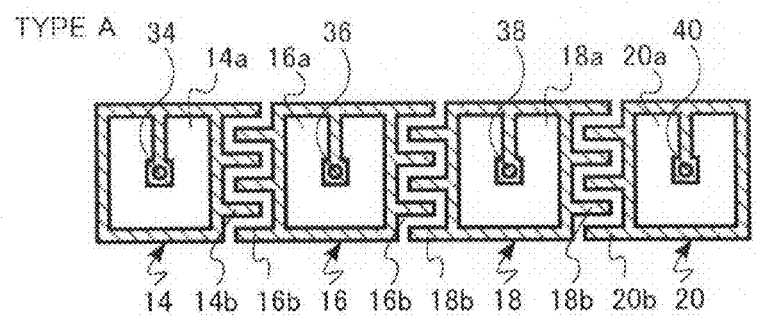
Figure 2C:
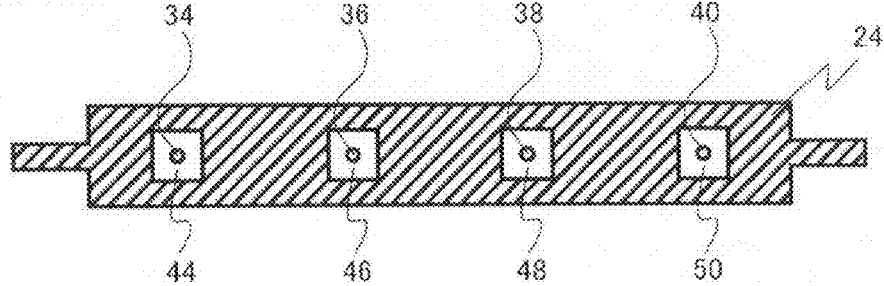

FIGS. 2A through 2C are schematic top views of components of the EBG structure of this embodiment. FIG. 2A shows the electrode plane, FIG. 2B shows the metal patches, and FIG. 2C shows the interconnect layer.

The electrode plane 10 is a conductor. The electrode plane 10 is in the form of a flat panel. The conductor serves as a ground plane or a power supply plane. The electrode plane 10 is a so-called reference plane. The electrode plane 10 is made of a metal such as aluminum (Al), copper (Cu), or gold (Au), for example.

The first insulating layer 12 is provided on the electrode plane 10. The first insulating layer 12 is made of resin, for example.

The first metal patch 14, the second metal patch 16, the third metal patch 18, and the fourth metal patch 20 are provided on the first insulating layer 12. The first through fourth metal patches 14, 16, 18, and 20 are made of aluminum (Al), copper (Cu), or gold (Au), for example.

The first metal patch 14 includes a first void 14a and a first comb-like end portion 14b. The second metal patch 16 includes a second void 16a and a second comb-like end portion 16b. The third metal patch 18 includes a third void 18a and a third comb-like end portion 18b. The fourth metal patch 20 includes a fourth void 20a and a fourth comb-like end portion 20b.

The first comb-like end portion 14b and the second comb-like end portion 16b are not in contact with each other, but mesh with each other while being separated from each other. The second end portion 16b and the third end portion 18b, and the third end portion 18b and the fourth end portion 20b are arranged in the same manner as above.

Figure 3A:
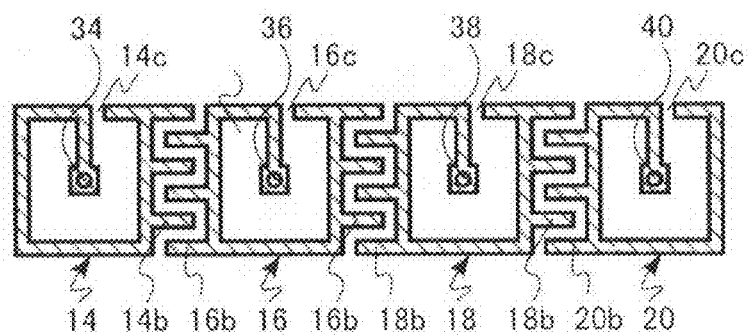
FIGS. 3A and 3B are diagrams showing other forms of metal patches of the first embodiment.
Figure 3B:
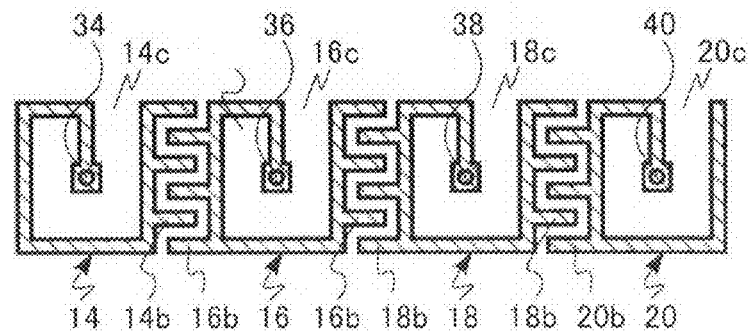

FIGS. 3A and 3B are diagrams showing other forms of metal patches of this embodiment. In both examples shown in FIGS. 3A and 3B, the metal patches have cuts.

Specifically, the first metal patch 14 includes a first cut 14c and a first comb-like end portion 14b. The second metal patch 16 includes a second cut 16c and a second comb-like end portion 16b. The third metal patch 18 includes a third cut 18c and a third comb-like end portion 18b. The fourth metal patch 20 includes a fourth cut 20c and a fourth comb-like end portion 20b.

In the following, the type of metal patch shown in FIG. 2B will be referred to as type A, the type shown in FIG. 3A will be referred to as type B, and the type shown in FIG. 3B will be referred to as type C.

The second insulating layer 22 is provided on the first metal patch 14, the second metal patch 16, the third metal patch 18, and the fourth metal patch 20. The second insulating layer 22 is made of resin, for example.

The interconnect layer 24 is provided on the second insulating layer 22. The interconnect layer 24 is provided right above the first through fourth metal patches 14, 16, 18, and 20, for example. The interconnect layer 24 extends in the alignment direction of the first through fourth metal patches 14, 16, 18, and 20, for example. The interconnect layer 24 is a signal line.

The interconnect layer 24 has a first opening 44, a second opening 46, a third opening 48, and a fourth opening 50. The interconnect layer 24 is made of aluminum (Al), copper (Cu), or gold (Au), for example.

The first via 34 is connected to the electrode plane 10 and the first metal patch 14. The first via 34 penetrates through the first opening 44 of the interconnect layer 24.

The second via 36 is connected to the electrode plane 10 and the second metal patch 16. The second via 36 penetrates through the second opening 46 of the interconnect layer 24.

The third via 38 is connected to the electrode plane 10 and the third metal patch 18. The third via 38 penetrates through the third opening 48 of the interconnect layer 24.

The fourth via 40 is connected to the electrode plane 10 and the fourth metal patch 20. The fourth via 40 penetrates through the fourth opening 50 of the interconnect layer 24.

In the following, the action and effects of this embodiment are described.

Figure 4A:
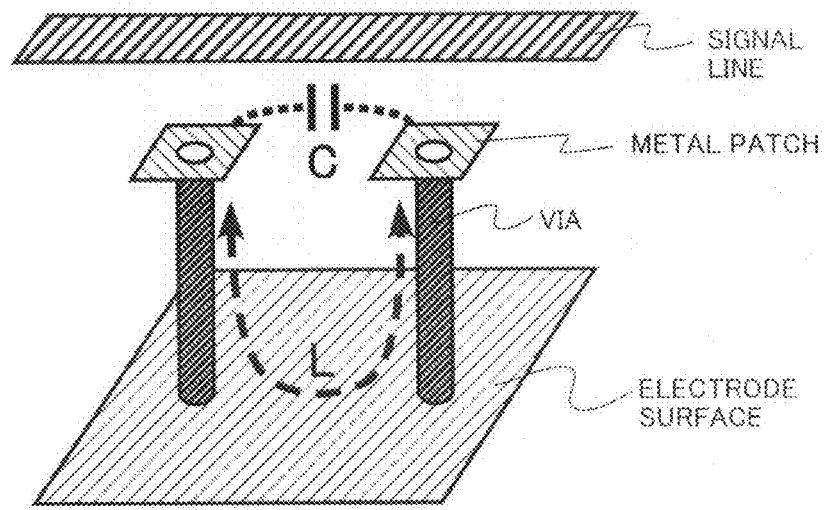
FIGS. 4A and 4B are diagrams for explaining the action of an EBG structure.
Figure 4B:
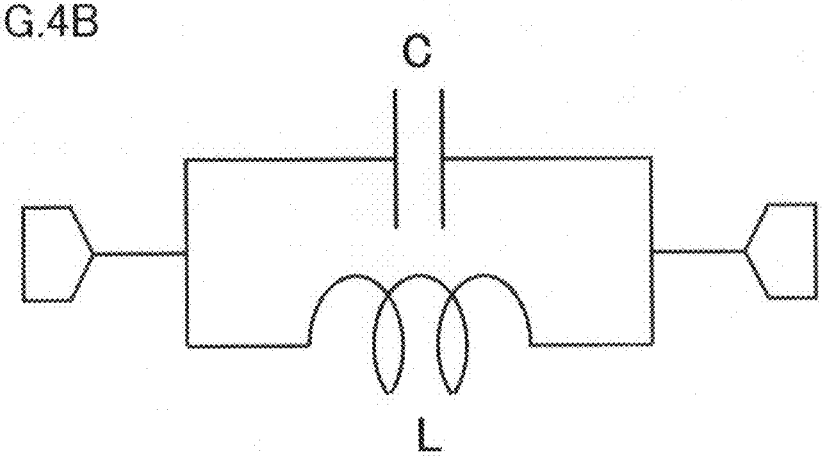

FIGS. 4A and 4B are diagrams for explaining the action of the EBG structure. FIG. 4A is a schematic perspective view of an example of the EBG structure, and FIG. 4B is an equivalent circuit diagram of the structure shown in FIG. 4A.

As shown in FIG. 4A, an example of the EBG structure includes two vias connected to an electrode plane, and two metal patches connected to the two respective vias. This EBG structure has a so-called "mushroom" structure. A signal line extends right above the metal patches.

As shown in the equivalent circuit diagram in FIG. 4B, the EBG structure is a LC parallel resonance circuit that includes a parasitic inductance component L and a parasitic capacitance component C. The EBG structure functions as a stop band filter.

The parasitic inductance component L is determined mainly by the distance between the metal patches or the electrical length. The parasitic capacitance component is determined mainly by the capacity between the metal patches. The capacity between the metal patches depends on the length of the facing end portions of the metal patches, or the fringe length.

To lower the cutoff frequency of the stop band filter, the electrical length and the fringe length need to be increased. Therefore, the vias need to be made longer, or the metal patches need to be made larger. As a result, the EBG structure becomes larger in size.

In this embodiment, cuts or voids are provided in the metal patches, so that the effective electrical length can be increased without a change in the size of each metal patch. Also, the comb-like end portions are provided in the metal patches, and the comb-like portions of adjacent metal patches are separated and mesh with each other. With this arrangement, the length of the facing end portions of the metal patches becomes larger. Accordingly, the fringe length becomes larger, and the parasitic capacitance increases. In other words, with small-size metal patches, the same cutoff frequency as that in the case where metal patches that have no cuts or voids and have no comb-like end portions are used.

Figure 5:
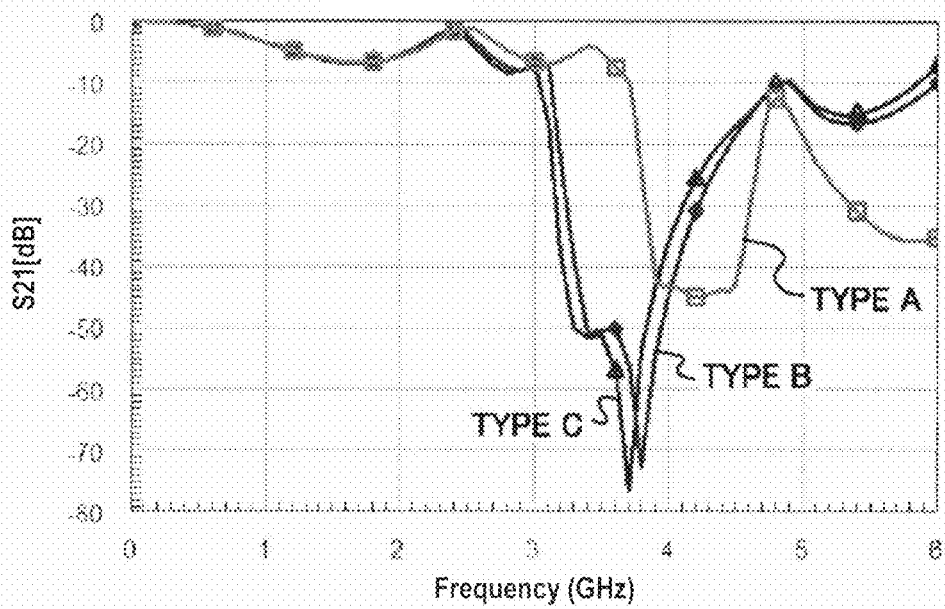
FIG. 5 is a graph showing the effects of the first embodiment.

FIG. 5 is a graph showing the effects of this embodiment. The pass characteristics (S21) in the cases of the metal patches of type A, type B, and type C are shown. The pass characteristics (S21) are obtained by simulations.

As can be seen from FIG. 5, each type has a cutoff band near 4 GHz. The types having cuts, such as type B and type C, have a large cutoff amount.

By adjusting the shapes of the metal patches, the cutoff band and the cutoff amount can be adjusted.

Figure 6:
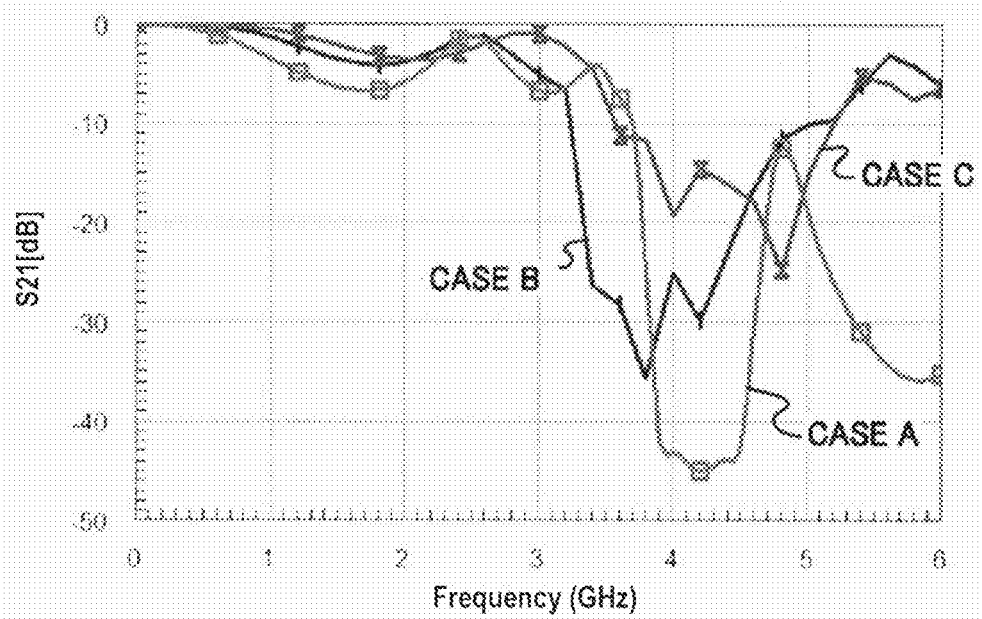
FIG. 6 is a graph showing the effects of the first embodiment.
Figure 7A:
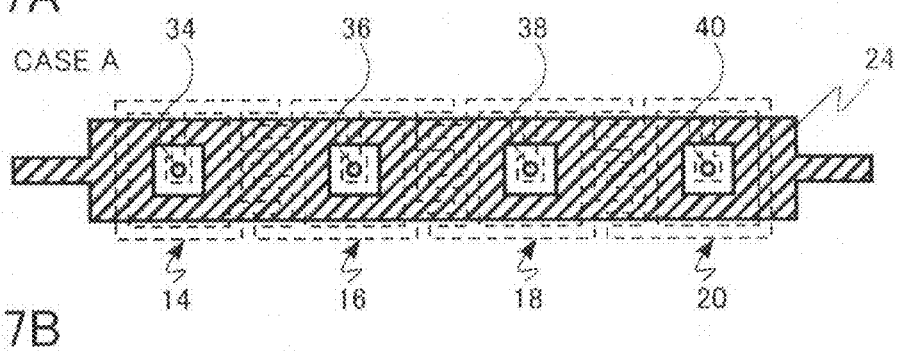
FIGS. 7A through 7C are schematic views of the structures used in simulations of the first embodiment.
Figure 7B:
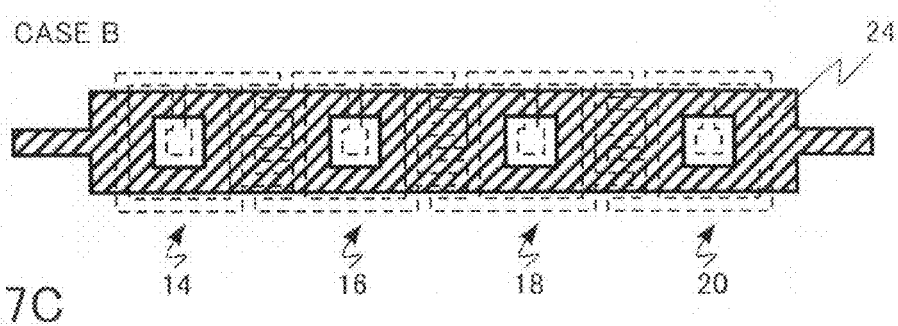
Figure 7C:
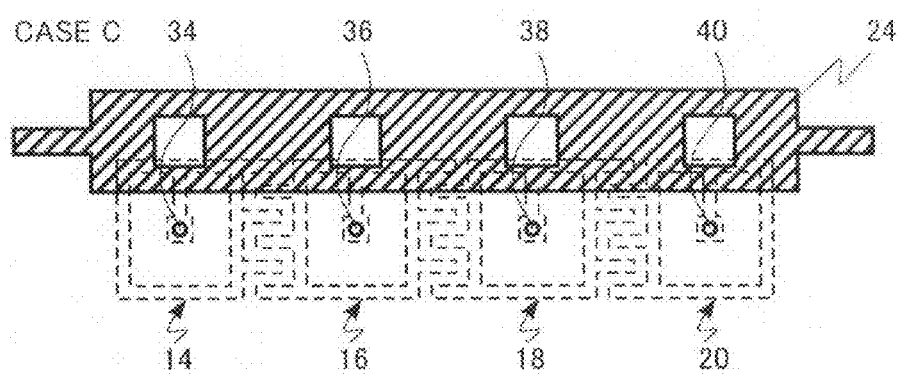

FIG. 6 is a graph showing the effects of this embodiment. FIGS. 7A through 7C are schematic views of the structures used in simulations. FIG. 7A shows a structure of this embodiment. FIG. 7B shows a structure in which the vias do not penetrate through the openings of the interconnect layer and stay in the metal patches. FIG. 7C shows a structure in which the interconnect layer is not provided right above the metal patches, and the vias pass by the interconnect layer. The structures shown in FIGS. 7A, 7B, and 7C are referred to as case A, case B, and case C, respectively. As shown in FIG. 7A, when the interconnect layer 24 is provided right above the metal patches 14, 16, 18 and 20, the center of the first via 34 coincides with the center of the first opening 44, the center of the second via 36 coincides with the center of the second opening 46, the center of the third via 38 coincides with the center of the third opening 48 and the center of the fourth via 40 coincides with the center of the fourth opening 50.

As shown in FIG. 6, case A of this embodiment has a cutoff band with a large cutoff amount near 4 GHz. Accordingly, an excellent cutoff effect can be realized.

Although the first through fourth metal patches 14, 16, 18, and 20 have cuts or voids in the above described examples, the first through fourth metal patches 14, 16, 18, and 20 may have shapes without cuts or voids, such as rectangular shapes or circular shapes. In this case, the effects to increase the cutoff characteristics can be achieved as the vias penetrate through the interconnect layer.

As described above, according to this embodiment, an EBG structure that has excellent characteristics in low-frequency regions and can be made smaller in size can be realized.

Second Embodiment

An EBG structure of this embodiment is the same as that of the first embodiment, except that the electrode plane has slits. Therefore, explanation of the same aspects as those of the first embodiment will not be repeated herein.

Figure 8A:
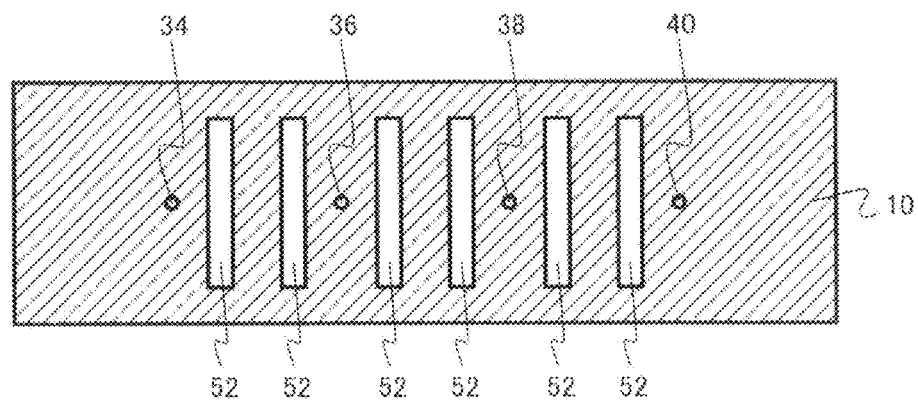
FIGS. 8A through 8C are schematic top views of components of an EBG structure of a second embodiment.
Figure 8B:
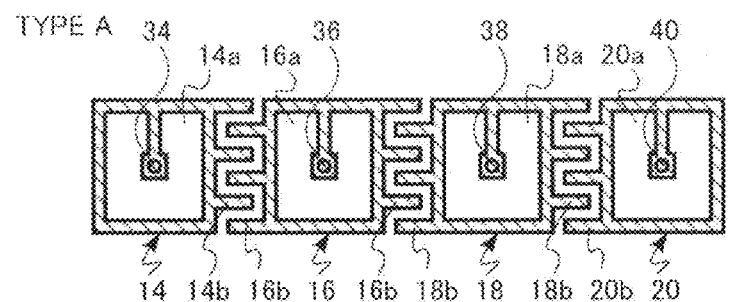
Figure 8C:
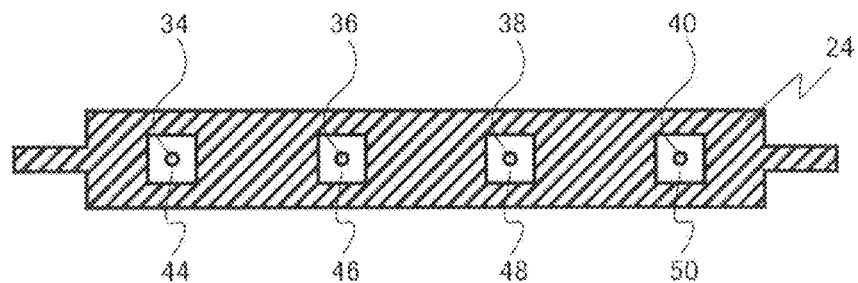

FIGS. 8A through 8C are schematic top views of components of the EBG structure of this embodiment. FIG. 8A shows the electrode plane, FIG. 8B shows the metal patches, and FIG. 8C shows the interconnect layer.

In the EBG structure of this embodiment, slits 52 are formed in the electrode plane 10. The slits 52 are provided between the first via 34 and the second via 36, between the second via 36 and the third via 38, and between the third via 38 and the fourth via 40, for example.

Figure 9:
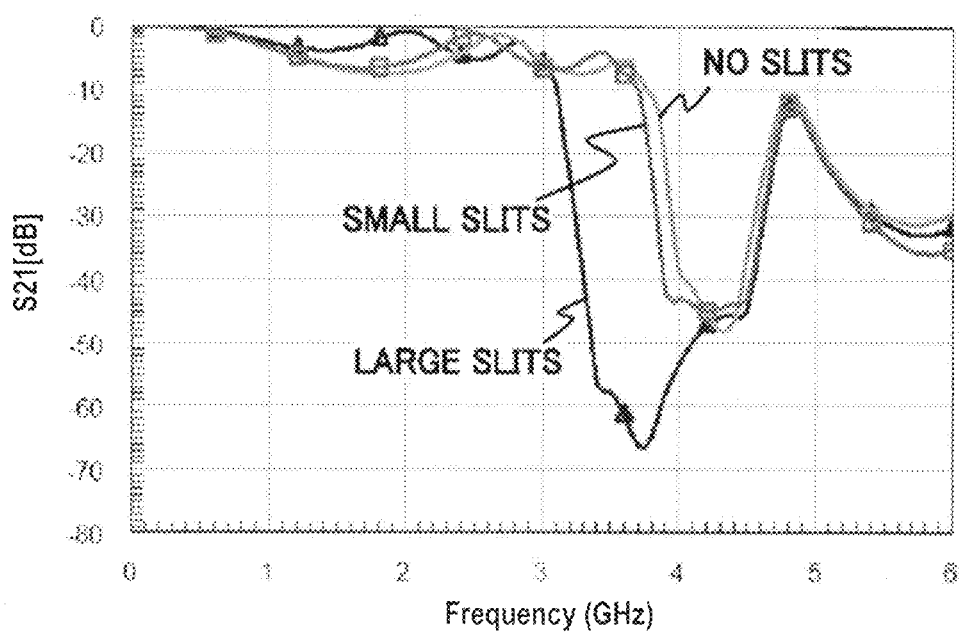
FIG. 9 is a graph showing the effects of the second embodiment.

FIG. 9 is a graph showing the effects of this embodiment. The pass characteristics (S21) in a case where no slits are provided (no slits), in a case where the slits are small (small slits), and in a case where the slits are large (large slits) are shown. The pass characteristics (S21) are obtained by simulations.

As the slits 52 are provided in the electrode plane 10, and the slits 52 are made larger, the cutoff frequency becomes lower, and the cutoff amount becomes larger, as can be seen from the graph. Accordingly, the cutoff characteristics in low-frequency bands can be improved without a change in size of the EBG structure.

So as to stabilize the cutoff characteristics, the slits 52 are preferably provided at regular intervals.

In the following, the effects of a reduction of the area occupied by the EBG structure of this embodiment is described.

Figure 10:
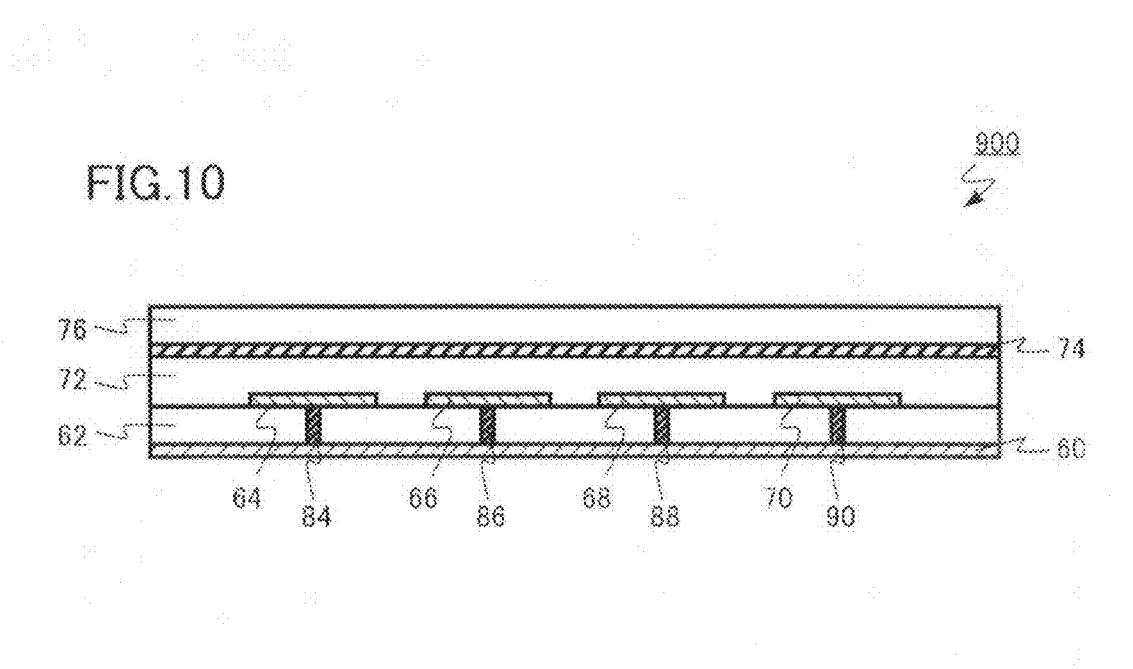
FIG. 10 is a schematic cross-sectional view of an EBG structure of a comparative example.

FIG. 10 is a schematic cross-sectional view of an EBG structure of a comparative example. The EBG structure 900 of the comparative example includes an electrode plane 60, a first insulating layer 62, first through fourth metal patches 64, 66, 68, and 70, a second insulating layer 72, an interconnect layer 74, a third insulating layer 76, and first through fourth vias 84, 86, 88, and 90.

Figure 11A:
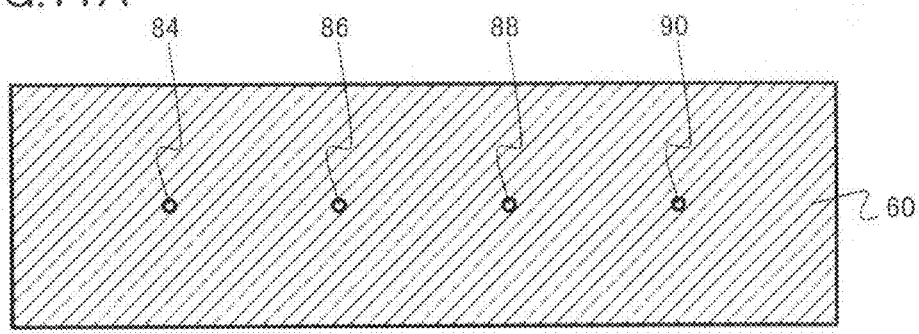
FIGS. 11A through 11C are schematic top views of components of the EBG structure of the comparative example.
Figure 11B:
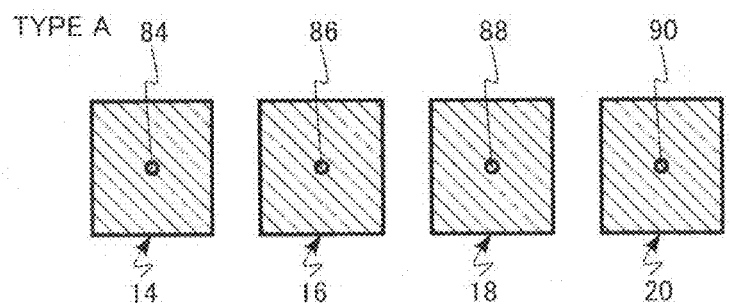
Figure 11C:

FIGS. 11A through 11C are schematic top views of components of the EBG structure of the comparative example. FIG. 11A shows the electrode plane, FIG. 11B shows the metal patches, and FIG. 11C shows the interconnect layer.

In the EBG structure of the comparative example, the first through fourth metal patches 64, 66, 68, and 70 have neither cuts nor comb-like end portions. The first through fourth vias 84, 86, 88, and 90 extend only to the lower layers of the first through fourth metal patches 64, 66, 68, and 70, and do not penetrate through the interconnect layer 74. No slits are formed in the electrode plane 50.

In the EBG structures of this embodiment and the comparative example, the layouts are optimized so that the cutoff amounts become −40 dB at the frequency of 4 GHz, and the occupied areas are compared with each other. In this embodiment, the occupied area is 25 mm$^2$. In the comparative example, the occupied area is 144 mm$^2$. Accordingly, according to this embodiment, the same cutoff characteristics can be realized with an occupied area that is one fifth or less of the occupied area of the comparative example.

As described above, according to this embodiment, an EBG structure that has excellent characteristics in low-frequency regions and can be made smaller in size can be further realized.

Third Embodiment

An EBG structure of this embodiment is the same as that of the first embodiment, except that the interconnect layer has wider portions facing the respective metal patches. Therefore, explanation of the same aspects as those of the first embodiment will not be repeated herein.

Figure 12:
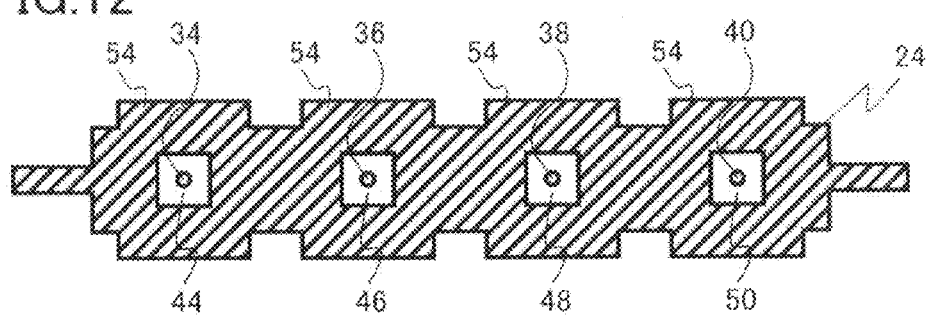
FIG. 12 is a schematic top view of the interconnect layer of an EBG structure of a third embodiment.

FIG. 12 is a schematic top view of the interconnect layer of the EBG structure of this embodiment. In the interconnect layer 24, wider portions 54 are formed in the regions facing the first through fourth metal patches 14, 16, 18, and 20. As shown in FIG. 12, widths of wider portions 54 are wider than the width of the interconnect layer 24.

According to this embodiment, the areas in which the first through fourth metal patches 14, 16, 18, and 20 face the interconnect layer 24 increase, and the capacitive coupling between the interconnect layer 24 and the EBG structure can be increased. Accordingly, the cutoff amount can be made larger.

As described above, according to this embodiment, an EBG structure that has excellent characteristics in low-frequency regions and can be made smaller in size can be further realized.

Fourth Embodiment

A circuit board of this embodiment includes an EBG structure according to one of the first through third embodiments. Therefore, explanation of the same aspects as those of the first through third embodiments will not be repeated herein.

Figure 13:
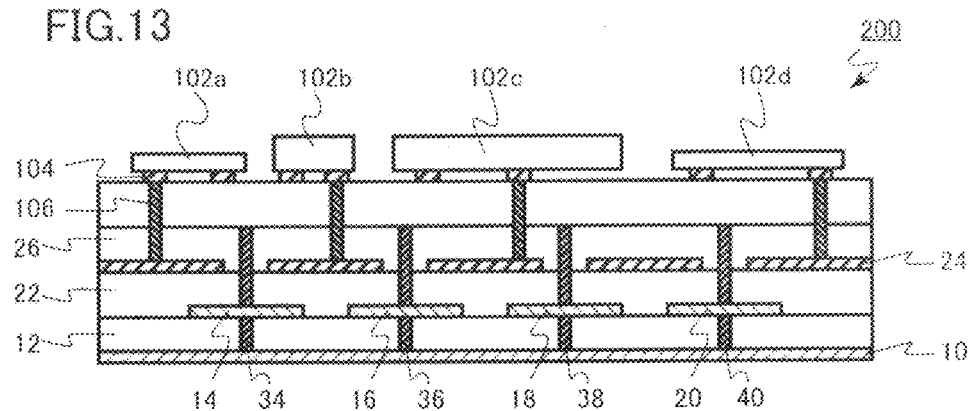
FIG. 13 is a schematic cross-sectional view of a circuit board of a fourth embodiment.

FIG. 13 is a schematic cross-sectional view of the circuit board of this embodiment. The circuit board 200 includes an EBG structure according to one of the first through third embodiments.

In the circuit board 200, electronic components 102a, 102b, 102c, and 102d are mounted on a printed wiring board via bumps 104, for example. The electronic components 102a, 102b, 102c, and 102d are semiconductor components such as logic LSIs or memories, or passive components such as capacitors, resistors, or coils, for example. The semiconductor components may be SOCs or pseudo SOCs.

The EBG structure is formed in the printed wiring board. The EBG structure includes an electrode plane 10, a first insulating layer 12, first through fourth metal patches 14, 16, 18, and 20, a second insulating layer 22, an interconnect layer 24, a third insulating layer 26, and first through fourth vias 34, 36, 38, and 40.

The electronic components 102a, 102b, 102c, and 102d are electrically connected to the interconnect layer 24 serving as a signal line through vias 106, for example. The electronic components 102a, 102b, 102c, and 102d may be connected to the electrode plane 10 through vias (not shown).

According to this embodiment, it is possible to realize a circuit board that operates in a stable manner in low-frequency regions, including an EBG structure that has excellent characteristics in low-frequency regions and can be made smaller in size.

Fifth Embodiment

A semiconductor device of this embodiment includes an EBG structure according to one of the first through third embodiments. Therefore, explanation of the same aspects as those of the first through third embodiments will not be repeated herein.

Figure 14:
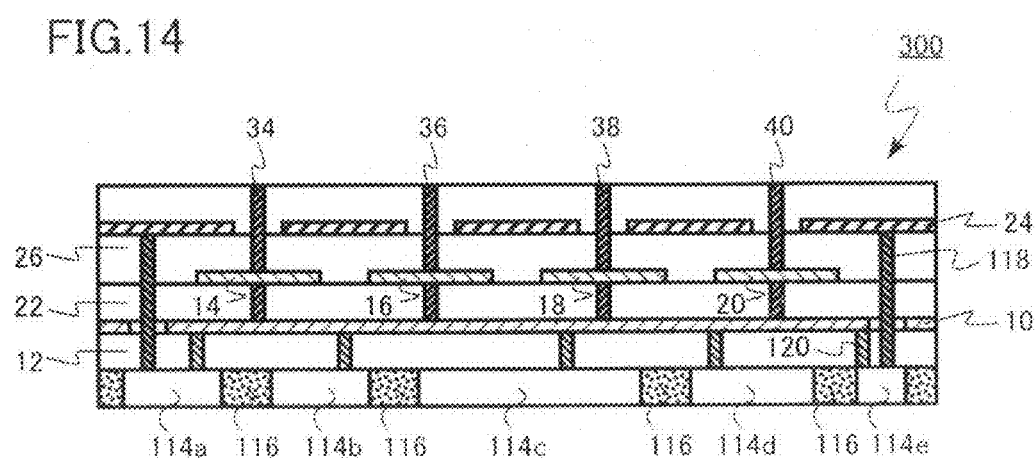
FIG. 14 is a schematic cross-sectional view of a semiconductor device of a fifth embodiment.

FIG. 14 is a schematic cross-sectional view of a semiconductor device of this embodiment. The semiconductor device 300 of this embodiment is a semiconductor component or a so-called pseudo SOC (system-on-chip) in which semiconductor chips are bonded to one another by resin, and the chips are connected to one another by an interconnect layer. The semiconductor device 300 includes an EBG structure according to one of the first through third embodiments.

The pseudo SOC 300 includes semiconductor chips 114a through 114e. The semiconductor chips 114a through 114e are bonded to one another by resin 116.

A multilayer interconnect for electrically connecting the semiconductor chips 114a through 114e to one another is provided on the semiconductor chips 114a through 114e. In this multilayer interconnect, the EBG structure is formed with the use of the interconnect of the multilayer interconnect and vias.

The EBG structure includes an electrode plane 10, a first insulating layer 12, first through fourth metal patches 14, 16, 18, and 20, a second insulating layer 22, an interconnect layer 24, a third insulating layer 26, and first through fourth vias 34, 36, 38, and 40.

The semiconductor chips 114a through 114e are electrically connected to the interconnect layer 24 through vias 118, for example. The semiconductor chips 114a through 114e are electrically connected to the electrode plane 10 through vias 120, for example.

According to this embodiment, it is possible to realize a semiconductor device that operates in a stable manner in low-frequency regions, including an EBG structure that has excellent characteristics in low-frequency regions and can be made smaller in size.

Although the number of metal patches is four in the above described embodiments, the number of metal patches is not limited to four, as long as the number is two or greater.

Although the semiconductor device is a pseudo SOC in the above described embodiment, this embodiment can be applied not only to pseudo SOCs but also to other semiconductor devices.

While certain embodiments have been described, these embodiments have been presented by way of example only, and are not intended to limit the scope of the inventions. Indeed, the EBG structure, the semiconductor device, and the circuit board described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An EBG structure comprising:
    an electrode plane having a plurality of slits;
    a first insulating layer provided on the electrode plane;
    a first metal patch provided on the first insulating layer;
    a second metal patch provided on the first insulating layer, the second metal patch being separately adjacent to the first metal patch;
    a second insulating layer provided on the first and second metal patches;
    an interconnect layer provided on the second insulating layer, the interconnect layer having a first opening and a second opening;
    a third insulating layer provided on the interconnect layer;
    a first via connected to the electrode plane and the first metal patch, the first via penetrating through the first opening; and
    a second via connected to the electrode plane and the second metal patch, the second via penetrating through the second opening.

2. The EBG structure according to claim 1, wherein
    the first metal patch has one of a first cut and a first void, and a first comb end portion,
    the second metal patch has one of a second cut and a second void, and a second comb end portion, and
    the first comb end portion and the second comb-like end portion mesh with each other while being separated from each other.

3. The EBG structure according to claim 1, wherein the interconnect layer is provided right above the first metal patch and the second metal patch.

4. The EBG structure according to claim 1, wherein the slits are provided at regular intervals.

5. The EBG structure according to claim 1, wherein the electrode plane is one of a ground plane and a power supply plane.

6. The EBG structure according to claim 1, wherein the interconnect layer extends in an alignment direction of the first metal patch and the second metal patch.

7. A semiconductor device comprising
    the EBG structure of claim 1.

8. A circuit board comprising
    the EBG structure of claim 1.

9. An EBG structure comprising:
    an electrode plane;
    a first insulating layer provided on the electrode plane;
    a first metal patch provided on the first insulating layer;
    a second metal patch provided on the first insulating layer, the second metal patch being separately adjacent to the first metal patch;

a second insulating layer provided on the first and second metal patches;

an interconnect layer provided on the second insulating layer, the interconnect layer having a first opening and a second opening and wider portions facing the first metal patch and the second metal patch;

a third insulating layer provided on the interconnect layer;

a first via connected to the electrode plane and the first metal patch, the first via penetrating through the first opening; and a second via connected to the electrode plane and the second metal patch, the second via penetrating through the second opening.

* * * * *